(12) United States Patent
Kole et al.

(10) Patent No.: US 10,477,742 B2
(45) Date of Patent: Nov. 12, 2019

(54) SHIELD FOR ACOUSTIC DEVICE

(71) Applicant: APPLE INC., Cupertino, CA (US)

(72) Inventors: Jared M. Kole, San Francisco, CA (US); Martin J. Auclair, Cupertino, CA (US); Richard A. Besen, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 59 days.

(21) Appl. No.: 14/681,447

(22) Filed: Apr. 8, 2015

(65) Prior Publication Data

US 2016/0073558 A1 Mar. 10, 2016

Related U.S. Application Data

(60) Provisional application No. 62/047,441, filed on Sep. 8, 2014, provisional application No. 62/047,561, filed on Sep. 8, 2014.

(51) Int. Cl.
*H05K 9/00* (2006.01)

(52) U.S. Cl.
CPC .................................. *H05K 9/0052* (2013.01)

(58) Field of Classification Search
CPC .. H05K 9/0052; H05K 9/0088; H05K 9/0075; H05K 9/0084; H05K 5/0091; H05K 9/0022; H05K 9/00; H05K 1/036; H04R 9/025; H04R 2499/11
USPC .................................................. 381/396, 398
See application file for complete search history.

(56) References Cited

U.S. PATENT DOCUMENTS

| 5,831,489 | A | * | 11/1998 | Wire | H05K 9/0075 |
| | | | | | 333/99 S |
| 7,550,679 | B1 | * | 6/2009 | Wershoven | H05K 9/0052 |
| | | | | | 174/377 |
| 2003/0003945 | A1 | * | 1/2003 | Saiki | H04M 1/03 |
| | | | | | 455/550.1 |
| 2004/0219328 | A1 | * | 11/2004 | Tasaki | C22C 30/00 |
| | | | | | 428/692.1 |
| 2006/0182304 | A1 | * | 8/2006 | Takase | H04R 9/025 |
| | | | | | 381/412 |
| 2008/0044044 | A1 | * | 2/2008 | Madaffari | H04R 9/025 |
| | | | | | 381/186 |
| 2009/0291718 | A1 | * | 11/2009 | Fukazawa | H04M 1/03 |
| | | | | | 455/575.1 |
| 2010/0304796 | A1 | * | 12/2010 | Stohr | H04M 1/03 |
| | | | | | 455/575.1 |
| 2011/0117838 | A1 | * | 5/2011 | Bosquet | G06K 19/07739 |
| | | | | | 455/41.1 |

(Continued)

FOREIGN PATENT DOCUMENTS

JP 2003297629 A * 10/2003

*Primary Examiner* — Yogeshkumar Patel
(74) *Attorney, Agent, or Firm* — Kilpatrick Townsend and Stockton, LLP

(57) ABSTRACT

An electronic device having one or more magnets disposed within it (e.g., such as in a speaker) is equipped with a magnetic shield that attenuates magnetic fields propagating outside of the electronic device. The magnetic shield may be placed within the device such that it redirects the magnetic fields to contain them better within the one or more magnets, resulting in improved magnetic efficiency. In further embodiments, the magnetic shield may also function as a structural part of the electronic device and/or an electronic component with in the electronic device.

9 Claims, 3 Drawing Sheets

(56) References Cited

U.S. PATENT DOCUMENTS

| | | | | |
|---|---|---|---|---|
| 2012/0177247 | A1* | 7/2012 | Li | H04R 9/025 381/412 |
| 2012/0263338 | A1* | 10/2012 | Hori | H04R 3/02 381/398 |
| 2013/0328648 | A1* | 12/2013 | Kuivallainen | H04B 1/38 335/219 |
| 2014/0056448 | A1* | 2/2014 | Kuivalainen | H04R 1/023 381/189 |
| 2014/0153755 | A1* | 6/2014 | Hug | H04R 25/604 381/315 |
| 2014/0218867 | A1* | 8/2014 | Kim | H05K 9/0088 361/704 |
| 2014/0266030 | A1* | 9/2014 | Park | H01F 27/34 320/108 |
| 2014/0334649 | A1* | 11/2014 | Fromel | H04R 1/12 381/189 |
| 2014/0342783 | A1* | 11/2014 | Suzuki | H04M 1/0266 455/569.1 |
| 2014/0355812 | A1* | 12/2014 | Tossavainen | H04R 1/02 381/395 |

* cited by examiner

SHIELD FOR ACOUSTIC DEVICE

CROSS REFERENCE TO RELATED APPLICATIONS

This application claims priority to U.S. provisional patent application Ser. No. 62/047,441, for "EARPIECE INTEGRATED MAGNETIC SHIELDING FOR MITIGATING INGRESS OF MAGNETIC PARTICLES" and U.S. provisional patent application Ser. No. 62/047,561, for "SHIELD FOR ACOUSTIC DEVICE" both filed on Sep. 8, 2014 which are hereby incorporated by reference in their entirety for all purposes.

FIELD

The described embodiments relate generally to electronic devices that employ magnetic components, such as speakers, within the housing of the electronic device. More particularly, the present embodiments relate to shields employed within electronic devices that can be used to attenuate external magnetic fields that originate from the magnetic components.

BACKGROUND

Currently there are a wide variety of electronic devices that include speakers and other magnetic components located within the electronic device. The speakers typically include magnets which may have magnetic fields that propagate outside of the electronic device. As electronic devices become thinner and the speakers within them more powerful, the magnetic fields generated outside of the electronic devices have increased commensurately. The external magnetic fields may adversely interact with adjacent articles such as the magnetic strip on credit cards and other magnetically susceptible materials.

New electronic devices may require new features or new methods to reduce magnetic fields that propagate outside of the electronic device.

SUMMARY

An electronic device has a housing that forms an exterior surface. The electronic device has a speaker disposed within the housing. The speaker has one or more magnets that generate magnetic fields. A plate of high permeability material is disposed within the electronic device and oriented such that it attenuates magnetic fields outside of the housing. In some embodiments the plate of high permeability material may be the rear panel of housing, while in other embodiments the plate may be an insert within the rear panel of the electronic device. In further embodiments the plate may be disposed on an inner surface of the electronic device. In yet further embodiments the plate may be a diaphragm of the speaker. The plate of high permeability material may be configured to increase the magnetic fields in the speaker, improving its performance and/or efficiency.

A method of attenuating magnetic fields on the exterior of an electronic device is disclosed. The housing for the electronic device comprises a front panel disposed parallel to and spaced a distance apart from a rear panel. A speaker is disposed within the housing and located between the front panel and the rear panel. A plate of high permeability material is disposed within the electronic device such that magnetic fields from the speaker that pass through the rear panel are attenuated. In some embodiments the plate of high permeability material may also be configured to increase magnetic fields within the speaker resulting in improved performance and/or efficiency of the speaker. In further embodiments the plate of high permeability material may be a rear panel of the electronic device or an insert disposed in the rear panel. In further embodiments the plate may be disposed on inner surface of the rear panel of the electronic device.

To better understand the nature and advantages of the present invention, reference should be made to the following description and the accompanying figures. It is to be understood, however, that each of the figures is provided for the purpose of illustration only and is not intended as a definition of the limits of the scope of the present invention. Also, as a general rule, and unless it is evident to the contrary from the description, where elements in different figures use identical reference numbers, the elements are generally either identical or at least similar in function or purpose.

DETAILED DESCRIPTION

Certain embodiments of the present invention relate to electronic devices that incorporate magnetic shields. While the present invention can be useful for a wide variety of electronic devices that incorporate magnetic shields, some embodiments of the invention are particularly useful for using the magnetic shields to attenuate magnetic forces that propagate outside of the electronic device, as described in more detail below.

Figure 1A:
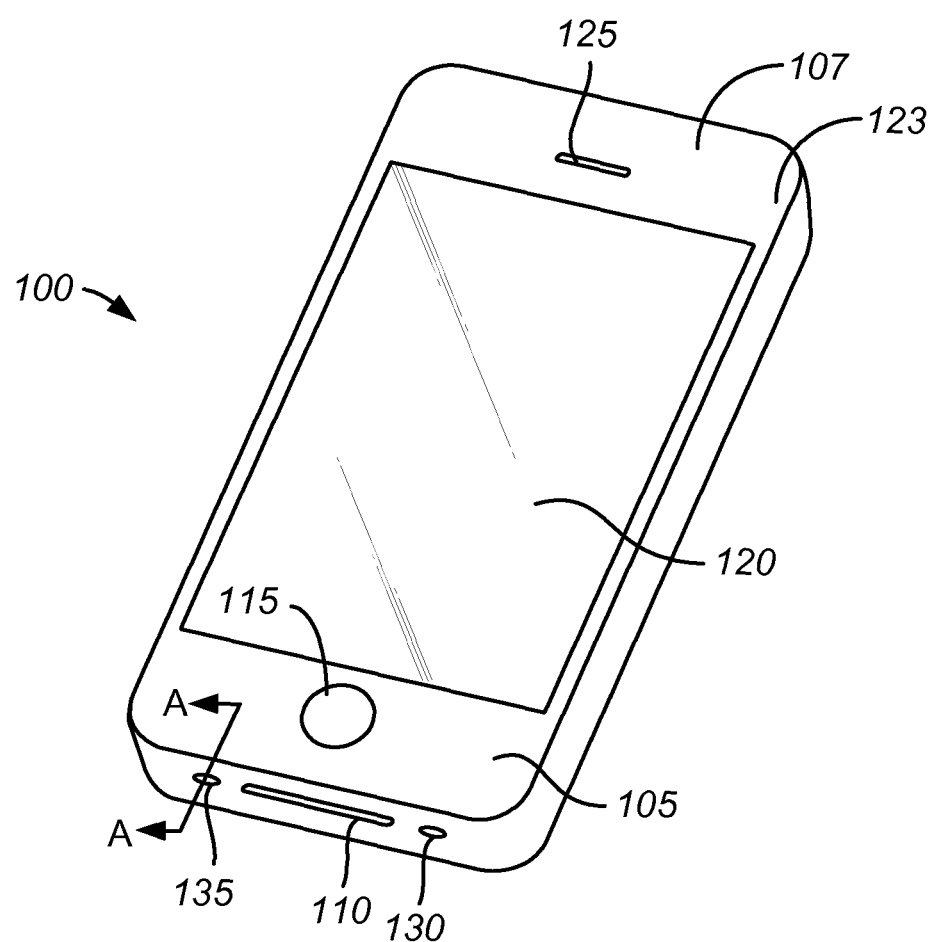
FIG. 1A is a front perspective view of an electronic device according to an embodiment of the invention.

FIG. 1A depicts an illustrative rendering of one embodiment of an electronic device 100 that includes a housing 105 with exterior surface 107 having a receptacle connector 110, a multipurpose button 115 as an input component and a touch screen display 120 as both an input and output component. Touch screen display 120 may be disposed on a front panel 123 of housing 105. Electronic device 100 also has one or more microphones and speakers as described in more detail below.

In one embodiment, electronic device 100 is a phone and has a receiver aperture 125 containing one or more acoustic elements (i.e., a speaker or a microphone). In another embodiment receiver aperture 125 contains a speaker for a user to hear a caller as well as a microphone disposed in the same aperture that can be used for noise cancellation or other purposes. Electronic device 100 may also have additional acoustic elements disposed in other apertures within housing 105. In some embodiments electronic device 100 may have a transmitter aperture 130 containing a microphone to receive a user's voice. Further embodiments may have a loudspeaker aperture 135 containing a speaker for features such as a speakerphone. Although examples of apertures containing acoustic elements have been provided, other configurations are possible and within the scope of this disclosure.

Figure 1B:
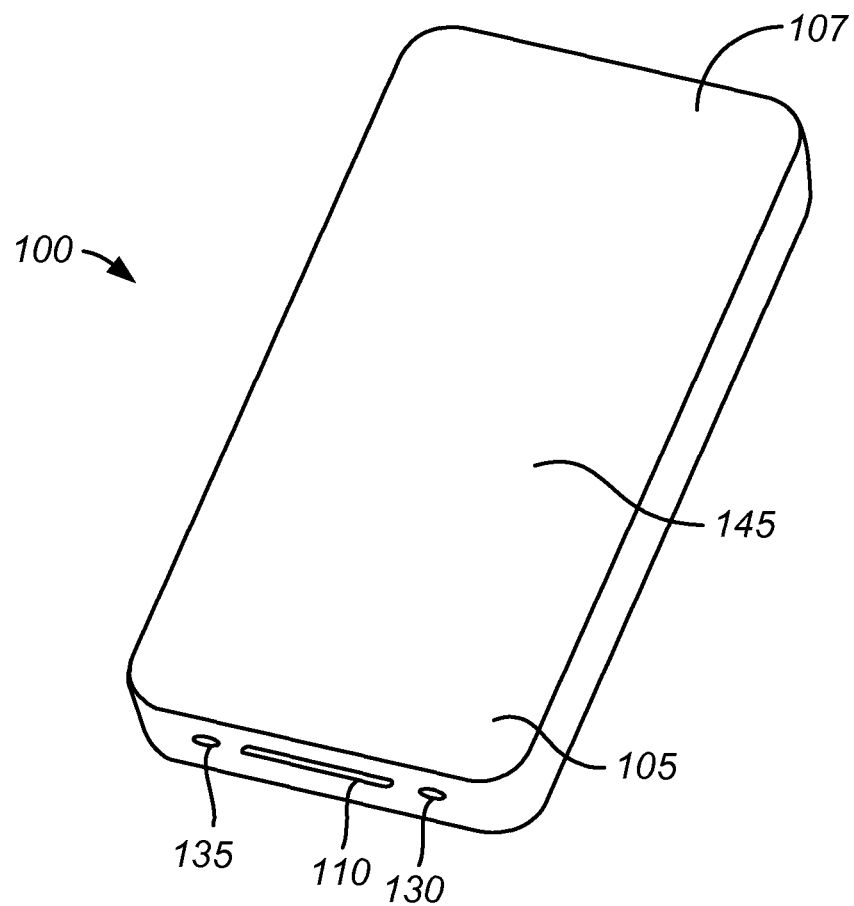
FIG. 1B is a rear perspective view of the electronic device depicted in FIG. 1.

Now referring to FIG. 1B, a rear view of electronic device 100 is illustrated. Electronic device 100 may have a rear panel 145 that forms a portion of housing 105. Rear panel 145 may be parallel to and spaced a distance apart from front panel 123 (see FIG. 1A). Rear panel 145 may also form a portion of exterior surface 107 of electronic device 100.

In order to better appreciate the features and aspects of integrated speakers and methods of attenuating external magnetic fields, further context for the invention is provided in the following section by discussing one particular implementation of an electronic device according to an embodiment of the present invention.

Figure 2:
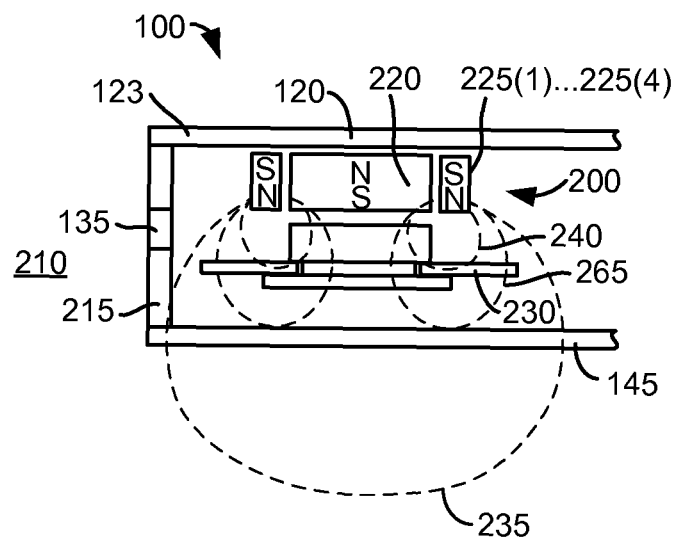
FIG. 2 is a partial cross-sectional view of the loudspeaker aperture shown in FIG. 1, according to an embodiment of the invention.

Now referring to FIG. 2, a simplified cross-section A-A through loudspeaker aperture 135 and a portion of electronic device 100 illustrated in FIG. 1 is shown. Speaker 200 is disposed within electronic device 100 between front panel 123 and rear panel 145. Speaker 200 may communicate with the exterior environment 210 through loudspeaker aperture 135 disposed in a bottom surface 215 of electronic device 100.

In some embodiments, speaker 200 may have a primary magnet 220 with four secondary magnets 225(1) . . . 225(4) that are energized to make diaphragm 230 move up and down such that sound waves may be generated and propagate out of loudspeaker aperture 135. Magnets 220, 225(1) . . . 225(4) may generate magnetic fields that may propagate through rear panel 145 of housing and interfere with magnetically susceptible articles. In some embodiments a magnetic shield may be disposed between magnets 220, 225(1) . . . 225(4) and rear panel 145 to attenuate magnetic fields outside of electronic device 100, as discussed in more detail below.

In one embodiment secondary magnets 225(1) . . . 225(4) may be disposed equidistance from each other on the four sides of the primary magnet, however in other embodiments different magnet configurations may be used. In some embodiments, primary magnet 220 may have a North pole disposed towards display 120 and a South pole disposed towards rear panel 145. In further embodiments each of secondary magnets 225(1) . . . 225(4) may have North poles disposed towards rear panel 145 and South poles disposed towards front panel 123. In yet further embodiments, primary and secondary magnets, 220, 225(1) . . . 225(4) respectively, may be arranged in a common plane, while in other embodiments the magnets may be in different planes. Other embodiments may have different quantities, configurations and/or orientations of magnets. In some embodiments magnets 220, 225(1) . . . 225(4) may be permanent magnets while in other embodiments the magnets may be electro-magnets. Primary magnet 220 with four secondary magnets 225(1) . . . 225(4) may generate one or more magnetic fields causing diaphragm 230 to move such that it generates sound.

FIG. 2 further illustrates example representations of magnetic fields 235, 240 and 265 emanating from magnets 220, 225(1) . . . 225(4). Magnetic field 235 is an approximate representation of one example of a magnetic field in the absence of a magnetic shield, as discussed in more detail below. As shown, magnetic field 235 may exist outside of electronic device 100 and may be strong enough to adversely interact with adjacent articles such as a credit card magnetic strip.

Continuing to refer to FIG. 2, in one embodiment, rear panel 145 may be made from a high permeability material and perform as a magnetic shield that attenuates magnetic field 235, as discussed in more detail below. Magnetic field 265 is an approximate representation of the magnetic fields when rear panel 145 is manufactured from a high permeability material. Noticeably, a substantial portion of magnetic field 235 is attenuated and moved towards rear panel 145, significantly reducing the magnetic field outside of electronic device 100. In some embodiments, improved containment of the magnetic fields may also improve the efficiency of speaker 200, as a larger percentage of the magnetic fields are used to move diaphragm 230.

In other embodiments only a portion of rear panel 145 may be made from a high permeability material. For example, in one embodiment a plate of high permeability material may be insert-molded within rear panel 145, while in another embodiment a plate of high permeability material may be laminated to rear panel 145. In another embodiment, diaphragm 230 of speaker 200 may be manufactured from a high permeability material. Magnetic field 240 is an approximate representation of the magnetic fields when diaphragm 230 is manufactured from a high permeability material. As illustrated, the magnetic fields may be even more tightly contained within speaker 200.

A high permeability material as discussed herein may be any material with a relatively high permeability. The permeability of a material is the measure of the material's ability to support the formation of a magnetic field within itself. It is the degree of magnetization that a material obtains in response to an applied magnetic field. Thus, the more "magnetically conductive", or the less resistance a material is to magnetic fields, the higher its permeability. Following this behavior, magnetic shields as discussed herein essentially re-direct the magnetic fields from the magnets so they are more contained within speaker 200 and fewer stray fields penetrate rear housing panel 145 and exist outside of electronic device 100.

With regard to improving speaker 200 performance, as discussed above, magnetic shielding does not eliminate or destroy magnetic fields, instead it provides a more efficient (i.e., less restrictive) path for the magnetic field to complete its path. Therefore, a larger portion of the magnetic fields generated by magnets 220, 225(1) . . . 225(4) are contained within speaker 200, and are used to make diaphragm 230 move, improving its performance. More specifically, as defined herein, attenuating magnetic fields shall mean to reduce the strength of a magnetic field in a particular location, usually by redirecting the magnetic field to a different location.

With regard to magnetic shielding materials, typically, the higher the permeability of the material, the more effective it will be as a magnetic shield. In some embodiments, for example, a high permeability low carbon steel may be used having a permeability in the range of 4000-5000, depending on how pure it is. In other embodiments, for example, a nickel-iron-molybdenum alloy (e.g., permalloy) having a relative permeability of approximately 300,000 or cobalt-iron alloys (e.g., Hiperco 27, Hiperco 50 or Vaccoflux) having a permeability in the range of approximately 3,000 to 15,000 may be used. Myriad high permeability metals and materials exist and are within the scope of this disclosure.

The magnetic shield may be formed with any process, including, but not limited to stamping, etching, or cutting. The magnetic shield may also be insert molded within one or more plastic components of the electronic device. In one embodiment the magnetic shield may be laminated to an inner surface of an aluminum rear panel, however other configurations are within the scope of this disclosure.

Figure 3:
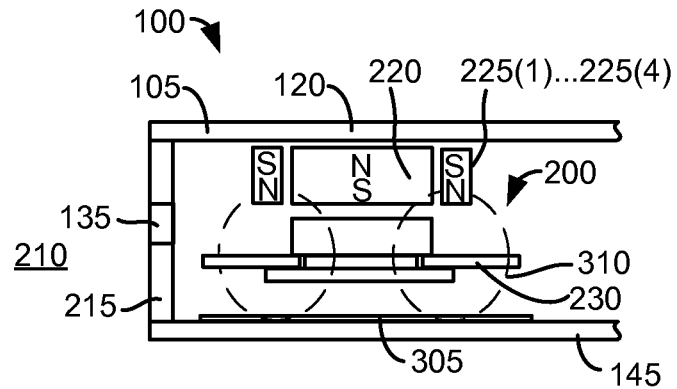
FIG. 3 is a partial cross-sectional view of the loudspeaker aperture shown in FIG. 1, according to another embodiment of the invention.

Now referring to FIG. 3, another embodiment is illustrated. This embodiment is similar to the embodiment illustrated in FIG. 2, however in this embodiment a separate plate of high permeability material 305 has been bonded the an inner surface of rear panel 145. Plate 305 may be made from a high permeability material and may attenuate magnetic fields from passing through rear panel 145. As illustrated, magnetic field 310 is an approximate representation of magnetic fields when plate 305 is manufactured from a high permeability material. As further illustrated, the magnetic fields are contained within speaker 200 and they are attenuated external to electronic device 100. In yet further embodiments, a plate of high permeability material may be disposed anywhere within electronic device 100. In some embodiments the plate may be disposed between primary and secondary magnets, 220, 225(1) . . . 225(4) and rear panel 145 such and placed in a plane that is parallel and adjacent to a plane that primary and secondary magnets, 220, 225(1) . . . 225(4) respectively, reside in. However, in other embodiments the plate may be placed between the magnets and the front panel 123 (see FIG. 1) or any of the sides of electronic device 100.

In some embodiments, plate 230 may perform both structural functions as well as magnetic shielding functions. More specifically, as discussed above, rear panel 145 of housing may be made entirely of or partially of a high permeability material. In such embodiments the high permeability material may be at least a portion of housing 105 of electronic device 100. In other embodiments the high permeability material may comprise a component of speaker 200, such as diaphragm 230. As discussed above, in further embodiments, a high permeability shield may simultaneously improve the performance of speaker 200 as well as perform a structural function and attenuate external magnetic fields. Therefore, in some embodiments not only does a high permeability shield decrease the likelihood of magnetic fields from within the electronic device interfering with magnetically susceptible articles, it may also improve the performance of speaker 200 and function as a housing for the electronic device.

Figure 4:
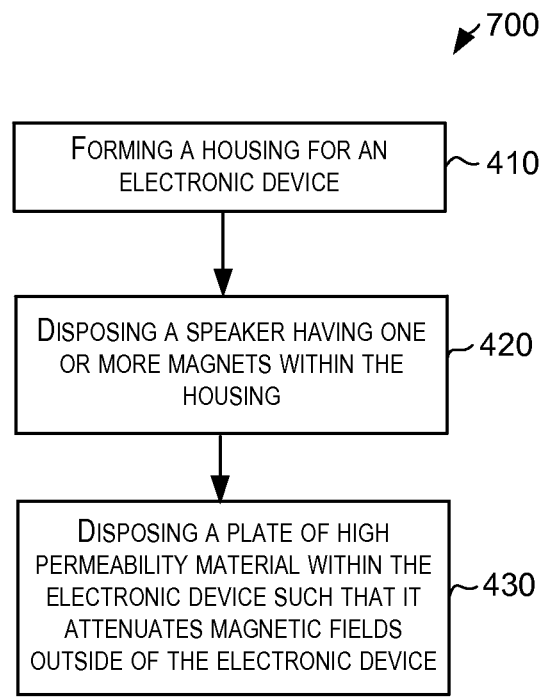
FIG. 4 is a flowchart of a method of attenuating magnetic fields within an electronic device, according to an embodiment of the invention.

Now referring to FIG. 4, a method of forming an electronic device having a magnetic shield is disclosed. In step 410 a housing for an electronic device is formed. The housing may be made from a metal, a plastic or any other material. The housing may have a front panel that contains a screen and one or more interface buttons. The front panel may be disposed parallel to and a distance from a rear panel. In step 420 a speaker with one or more magnets is disposed between the front panel and the rear panel. The speaker may be used for myriad functions, including a speakerphone. In step 430 a plate of high permeability material is disposed within the electronic device. The plate is placed between the speaker and the rear panel such that it can attenuate magnetic forces outside of the electronic device. In other embodiments the plate may be placed anywhere within the electronic device to reduce magnetic fields created outside of the electronic device.

Although electronic device 100 (see FIG. 1) is described and illustrated as one particular electronic device, embodiments of the invention are suitable for use with a multiplicity of electronic devices and electromechanical devices. For example, any device that receives or transmits audio, video or data signals may be used with the invention. Further, any type of motor or voice coil motor/module may be used with the invention. In some instances, embodiments of the invention are particularly well suited for use with portable electronic media devices because of their potentially small form factor. As used herein, an electronic media device includes any device with at least one electronic component that may be used to present human-perceivable media. Such devices may include, for example, portable music players (e.g., MP3 devices and Apple's iPod devices), portable video players (e.g., portable DVD players), cellular telephones (e.g., smart telephones such as Apple's iPhone devices), video cameras, digital still cameras, projection systems (e.g., holographic projection systems), gaming systems, PDAs, as well as tablet (e.g., Apple's iPad devices), laptop or other mobile computers. Some of these devices may be configured to provide audio, video or other data or sensory output.

For simplicity, various internal components, such as the control circuitry, graphics circuitry, bus, memory, storage device and other components of electronic device 100 (see FIG. 1) are not shown in the figures.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. An electronic device comprising:
    a housing forming an exterior surface of the electronic device, the housing having a front panel disposed opposite a rear panel, wherein the rear panel is formed from a high permeability magnetic material;
    a speaker disposed within the housing and including a primary magnet and a speaker diaphragm, wherein the speaker diaphragm is oriented parallel to the front panel and the rear panel; and
    a side panel extending between the front and rear panels and oriented substantially perpendicular to the speaker diaphragm, the side panel having a speaker aperture formed there through that is acoustically coupled to the speaker.

2. The electronic device of claim 1 wherein the rear panel of high permeability magnetic material is configured to increase magnetic fields within the speaker.

3. The electronic device of claim 1 further comprising a plurality of secondary magnets that includes four secondary magnets arranged around the primary magnet.

4. The electronic device of claim 3 wherein the four secondary magnets are arranged in a common plane with the primary magnet and are disposed equidistant from one another on four sides of the primary magnet.

5. The electronic device of claim 3 wherein magnetic fields emanate from the primary magnet and the four secondary magnets.

6. An electronic device comprising:
    a housing formed from a front panel, a rear panel and a side panel, wherein the front panel is oriented parallel to and spaced a distance apart from the rear panel, wherein the side panel extends between the front panel and the rear panel, and wherein the rear panel is formed from a high permeability magnetic material;
    a speaker disposed within the housing between the front panel and the rear panel and having a primary magnet and a speaker diaphragm, wherein the speaker diaphragm is oriented substantially perpendicular to the side panel; and a speaker aperture formed through the side panel.

7. The electronic device of claim 6 wherein the rear panel of high permeability magnetic material is configured to increase magnetic fields within the speaker.

8. A method of attenuating magnetic fields outside of an electronic device comprising:

forming a housing for the electronic device, comprising a front panel disposed parallel to and spaced a distance apart from a rear panel and a side panel extending between the front panel and the rear panel, wherein the rear panel is formed from a high permeability magnetic material;

disposing a speaker between the front panel and the rear panel wherein the speaker includes a primary magnet and a diaphragm oriented perpendicular to the side panel; and forming a speaker aperture through the side panel.

9. The method of claim 8 wherein the rear panel of high permeability magnetic material is configured to increase magnetic fields within the speaker.

* * * * *